United States Patent
Kim et al.

(10) Patent No.: US 11,849,568 B2
(45) Date of Patent: Dec. 19, 2023

(54) MOTOR DRIVING APPARATUS AND CLEANER INCLUDING THE SAME

(71) Applicant: LG Electronics Inc., Seoul (KR)

(72) Inventors: Seongju Kim, Seoul (KR); Donggeun Lee, Seoul (KR)

(73) Assignee: LG Electronics Inc., Seoul (KR)

(*) Notice: Subject to any disclaimer, the term of this patent is extended or adjusted under 35 U.S.C. 154(b) by 553 days.

(21) Appl. No.: 17/010,935

(22) Filed: Sep. 3, 2020

(65) Prior Publication Data

US 2021/0068313 A1 Mar. 4, 2021

(30) Foreign Application Priority Data

Sep. 3, 2019 (KR) .................. 10-2019-0108706

(51) Int. Cl.
| | |
|---|---|
| *H05K 7/20* | (2006.01) |
| *H02K 11/33* | (2016.01) |
| *A47L 9/28* | (2006.01) |
| *H02P 27/06* | (2006.01) |

(52) U.S. Cl.
CPC ........ *H05K 7/20909* (2013.01); *A47L 9/2842* (2013.01); *A47L 9/2889* (2013.01); *H02K 11/33* (2016.01); *H02P 27/06* (2013.01)

(58) Field of Classification Search
CPC ........ A47L 5/22; A47L 9/2889; A47L 9/2884; A47L 9/2842; A47L 9/2831
See application file for complete search history.

(56) References Cited

U.S. PATENT DOCUMENTS

| | | | | |
|---|---|---|---|---|
| 2016/0094175 | A1* | 3/2016 | Yamasaki | H01L 23/367 318/724 |
| 2018/0062557 | A1* | 3/2018 | Tao | H02P 29/024 |
| 2018/0163747 | A1* | 6/2018 | Hayamitsu | F04D 29/582 |
| 2018/0216635 | A1 | 8/2018 | Hayamitsu | |
| 2018/0266438 | A1 | 9/2018 | Hayamitsu | |

(Continued)

FOREIGN PATENT DOCUMENTS

| | | |
|---|---|---|
| AU | 2016405035 | 8/2018 |
| EP | 1138242 | 10/2001 |

(Continued)

OTHER PUBLICATIONS

Extended European Search Report in European Appln. No. 20194238. 0, dated Feb. 18, 2021, 5 pages.

(Continued)

*Primary Examiner* — Andrew A Horton
(74) *Attorney, Agent, or Firm* — Fish & Richardson P.C.

(57) ABSTRACT

A motor driving apparatus for a cleaner includes a DC terminal capacitor, an inverter including switching elements configured to convert the DC power into AC power, a motor configured to operate the inverter, an impeller connected to the motor and configured to circulate air, and a printed circuit board having a first surface that mounts the switching elements and faces toward the motor and the impeller, and a second surface that mounts the DC terminal capacitor. The printed circuit board includes circuit elements mounted on a first area of the first surface and configured to carry a current having a level greater than or equal to a predetermined level. The first area is positioned in a flow path of the air circulated by the impeller.

8 Claims, 14 Drawing Sheets

(56) References Cited

U.S. PATENT DOCUMENTS

2018/0351483 A1* 12/2018 Arisawa ............ H02M 7/53873
2019/0101132 A1 4/2019 Fujiwara et al.

FOREIGN PATENT DOCUMENTS

| EP | 3081131 | 10/2016 |
| JP | 2016092920 | 5/2016 |
| JP | 2017184294 | 10/2017 |
| JP | 2019097373 | 6/2019 |
| KR | 1020130047144 | 5/2013 |

OTHER PUBLICATIONS

Korean Notice of Allowance in Korean Appln. No. 10-2019-0108706, dated Feb. 19, 2021, 3 pages (with English translation).
AU Office Action in Australian Appln. No. 2020227080, dated Apr. 30, 2021, 10 pages.

* cited by examiner

MOTOR DRIVING APPARATUS AND CLEANER INCLUDING THE SAME

CROSS-REFERENCE TO RELATED APPLICATION

This application claims the priority benefit of Korean Patent Application No. 10-2019-0108706, filed on Sep. 3, 2019, the disclosure of which is incorporated herein by reference in its entirety.

TECHNICAL FIELD

The present disclosure relates to a motor driving apparatus and a cleaner including the same, and more particularly to a motor driving apparatus and a cleaner including the same, which may minimize heat generation of circuit elements mounted on a printed circuit board.

BACKGROUND

Cleaners are devices for cleaning surfaces to be cleaned by suctioning or sweeping dust or foreign matter from the surfaces.

In order to provide a driving force to suction dust, the cleaner includes an impeller and a motor for rotating the impeller. The cleaner may discharge indoor air to the outside by the operation of the motor, thereby reducing internal pressure and generating suction force. By using the generated suction force, a suction means suctions foreign matter, such as dust and the like, from a surface to be cleaned along with outside air, and the foreign matter suctioned along with the outside air may be removed by a dust collector and the like.

Cleaners may be classified into various types, including a canister cleaner, an upright cleaner, a handheld cleaner, a stick cleaner, and the like. For example, as disclosed in related art 1 (Korean Laid-Open Patent Publication No. 10-2018-0100202), a handheld vacuum cleaner includes a suction pipe, an airflow generator, a cyclone, a power supply, and a handle.

Recently, with the increase in demand for such handheld vacuum cleaners, there has been a constant demand for lightweight and compact-sized electronic component modules mounted in the cleaner. Furthermore, in order to improve suction force, there is a need to increase a rotation velocity of a motor and a capacity of an inverter.

SUMMARY

In a system including an inverter which is driven using a battery having a voltage lower than a commercial voltage, a current having a high current value flows in a circuit for operation of the inverter. In this case, as the capacity of the inverter increases, a magnitude of the current flowing in the circuit also increases, causing a problem in that with the increase in the magnitude of the current, excessive heat generation of elements, (e.g., switching element, shunt resistor, etc.), which are related to the operation of the inverter, may occur.

Furthermore, as a rotation velocity of the motor increases, a switching frequency of switching elements included in the inverter increases. As a result, electromagnetic interference (EMI) noise is generated, which is electromagnetic noise generated by electromagnetic (EM) waves in electronic devices, thereby adversely affecting a normal control signal of electronic devices.

These problems may degrade performance of a product, reducing stability and reliability of the product.

It is an object of the present disclosure to provide a motor driving apparatus and a cleaner including the same, in which a printed circuit board is disposed according to a flow direction by considering a flow path of air circulated by the impeller, and heat-generating elements are mounted in an area corresponding to the flow path, thereby effectively dissipating heat generated by circuit elements mounted on the printed circuit board, preventing damage of elements in a product, and improving stability of the product.

It is another object of the present disclosure to provide a motor driving apparatus and a cleaner including the same, in which a power line, to which the EMI noise is transmitted, and a signal line, to which a control signal is transmitted, are electrically disconnected from each other in the printed circuit board; and the printed circuit board is configured such that a ground, to which the power line is connected, and a ground, to which the signal line is connected, are positioned on different layers of the printed circuit board which are physically separated from each other, thereby minimizing the effect of the EMI noise on the control signal.

In a motor driving apparatus according to an embodiment of the present disclosure to achieve the above objects, a printed circuit board is disposed such that a flow path of air circulated by an impeller may face one surface of the printed circuit board, on which heat-generating elements are mounted; primary heat-generating elements may be mounted in an area corresponding to the flow path on the one surface of the printed circuit board; other heat-generating elements may be mounted in an area, other than the mounting area of the primary heat-generating elements, on the one surface of the printed circuit board; and the remaining elements, other than the heat-generating elements, may be mounted on the other surface of the printed circuit board.

Further, in a motor driving apparatus according to an embodiment of the present disclosure to achieve the above objects, a power line pattern of a first outer layer, on which the primary heat-generating elements are mounted, is electrically disconnected on the first outer layer from a signal line pattern of the first outer layer on which the control circuit is mounted; the signal line pattern of the first outer layer is electrically connected to an output pattern of a second outer layer through via holes; and the power line pattern of the first outer layer is electrically connected to the output pattern of the first outer layer, such that while the EMI noise is transmitted to the output pattern of the first outer layer through the power line pattern of the first outer layer, the EMI noise may be output as it is to the outside on the output pattern of the first outer layer without affecting the signal line pattern of the first outer layer.

In accordance with an aspect of the present disclosure, the above and other objects can be accomplished by providing a motor driving apparatus, including: a DC terminal capacitor configured to store direct current (DC) power; an inverter including a plurality of switching elements and connected to the DC terminal capacitor, and configured to convert the DC power into alternating current (AC) power and to output the AC power; a motor configured to operate according to the AC power output from the inverter; an impeller connected to a rotary shaft of the motor and configured to circulate air; and a printed circuit board having one surface, on which the plurality of switching elements are mounted, and the other surface on which the DC terminal capacitor is mounted, wherein the one surface of the printed circuit board, on which the plurality of switching elements are mounted, is disposed to face toward the motor and the impeller; and among circuit elements mounted on the printed circuit board, circuit elements, through which a current at a level greater than or equal to a predetermined level flows, are mounted in a first area of the one surface of the printed circuit board, the first area corresponding to a flow path of the air circulated by the impeller.

The motor driving apparatus may further include a motor body having a motor accommodating part, in which the motor is accommodated, and an air outlet, through which the air circulated by the impeller is discharged, wherein the first area corresponds to a position of the air outlet.

The first area of the printed circuit board of the motor driving apparatus may be an area within a predetermined distance from an edge of the one surface of the printed circuit board.

The plurality of switching elements may be mounted in the first area of the one surface of the printed circuit board.

The motor driving apparatus may further include a DC terminal resistive terminal disposed between the DC terminal capacitor and the inverter, wherein the DC terminal resistive element may be mounted in the first area of the one surface of the printed circuit board.

The motor driving apparatus may further include a control circuit for controlling operation of the inverter, wherein the control circuit may be mounted in a second area, other than the first area, on the one surface of the printed circuit board.

In the motor driving apparatus, the printed circuit board may include a plurality of layers including a first outer layer, corresponding to the one surface, and a second outer layer corresponding to the other surface, wherein each of the plurality of layers may include: an input pattern, through which the DC power is input; an output pattern, through which the DC power is output; a power line pattern, through which a current at a level greater than or equal to a predetermined level is delivered; and a signal line pattern, which is electrically disconnected from the power line pattern, and through which a signal, transmitted and received to and from the control circuit, is transferred.

In the motor driving apparatus, the plurality of switching elements may be connected to the power line pattern of the first outer layer; the control circuit may be connected to the signal line pattern of the first outer layer; the output pattern and the power line pattern of the first outer layer may be electrically connected to each other; the output pattern and the power line pattern of the second outer layer may be electrically disconnected from each other; and the signal line pattern of the first outer layer may be electrically connected to the output pattern of the second outer layer through via holes.

In the motor driving apparatus, all the plurality of switching elements may be connected to the power line patterns of the plurality of layers; and the DC terminal resistive element may be connected to the power line pattern of the first outer layer.

In the motor driving apparatus, the plurality of layers may further include a first inner layer and a second inner layer disposed between the first outer layer and the second outer layer, wherein the input pattern, the output pattern, and the power line pattern of the first outer layer may be electrically connected to each other; at least any one of an input pattern and an output pattern of the first inner layer, being disposed adjacent to the first outer layer, is electrically disconnected from a power line pattern of the first inner layer; and at least any one of an input pattern and an output pattern of the second inner layer, being disposed between the first inner layer and the second outer layer, is electrically disconnected from a power line pattern of the second inner layer.

In the motor driving apparatus, the DC terminal capacitor may be connected between the input pattern and the output pattern of the second outer layer.

In accordance with another aspect of the present disclosure, the above and other objects can be accomplished by providing a cleaner including a motor driving apparatus, the motor driving apparatus including: a DC terminal capacitor configured to store direct current (DC) power; an inverter including a plurality of switching elements and connected to the DC terminal capacitor, and configured to convert the DC power into alternating current (AC) power and to output the AC power; a motor configured to operate according to the AC power output from the inverter; an impeller connected to a rotary shaft of the motor and configured to circulate air; and a printed circuit board having one surface, on which the plurality of switching elements are mounted, and the other surface on which the DC terminal capacitor is mounted, wherein the one surface of the printed circuit board, on which the plurality of switching elements are mounted, is disposed to face toward the motor and the impeller; and among circuit elements mounted on the printed circuit board, circuit elements, through which a current at a level greater than or equal to a predetermined level flows, are mounted in a first area of the one surface of the printed circuit board, the first area corresponding to a flow path of the air circulated by the impeller.

The cleaner may further include a DC terminal resistive terminal disposed between the DC terminal capacitor and the inverter, wherein the plurality of switching elements and the DC terminal resistive element may be mounted in the first area of the one surface of the printed circuit board.

The cleaner may further include a control circuit for controlling operation of the inverter, wherein the control circuit may be mounted in a second area, other than the first area, on the one surface of the printed circuit board.

In the cleaner, the printed circuit board may include a plurality of layers including a first outer layer, corresponding to the one surface, and a second outer layer corresponding to the other surface, wherein each of the plurality of layers may include: an input pattern, through which the DC power is input; an output pattern, through which the DC power is output; a power line pattern, through which a current at a level greater than or equal to a predetermined level is delivered; and a signal line pattern, which is electrically disconnected from the power line pattern, and through which a signal, transmitted and received to and from the control circuit, is transferred.

In the cleaner, the plurality of switching elements may be connected to the power line pattern of the first outer layer; the control circuit may be connected to the signal line pattern of the first outer layer; the output pattern and the power line pattern of the first outer layer may be electrically connected to each other; the output pattern and the power line pattern of the second outer layer may be electrically disconnected from each other; and the signal line pattern of the first outer layer may be electrically connected to the output pattern of the second outer layer through via holes.

In the cleaner, all the plurality of switching elements may be connected to the power line patterns of the plurality of layers; and the DC terminal resistive element may be connected to the power line pattern of the first outer layer.

In the cleaner, the plurality of layers may further include a first inner layer and a second inner layer disposed between the first outer layer and the second outer layer, wherein the input pattern, the output pattern, and the power line pattern of the first outer layer may be electrically connected to each other; at least any one of an input pattern and an output pattern of the first inner layer, being disposed adjacent to the first outer layer, may be electrically disconnected from a power line pattern of the first inner layer; at least any one of an input pattern and an output pattern of the second inner layer, being disposed between the first inner layer and the second outer layer, may be electrically disconnected from a power line pattern of the second inner layer; and the output pattern of the second outer layer may be electrically disconnected from the input pattern and the power line pattern which are electrically connected to each other.

According to various embodiments of the present disclosure, the heat-generating elements are mounted on one surface of the printed circuit board, which faces the flow path, by considering the flow path of air circulated by the impeller, such that heat generated by the circuit elements may be effectively dissipated, thereby preventing burning damage of the circuit elements and improving stability of a product.

In addition, according to various embodiments of the present disclosure, primary heat-generating elements are mounted in an area, corresponding to the flow path, on the one surface of the printed circuit board, and other heat-generating elements are mounted in an area, other than the mounting area of the primary heat-generating elements, on the one surface of the printed circuit board, thereby dissipating heat generated by the circuit elements more effectively.

Furthermore, according to various embodiments of the present disclosure, elements of the control circuit for controlling the inverter are mounted on the signal line pattern, which is electrically disconnected from the power line pattern of the printed circuit board, thereby reducing the effect of the EMI noise on the control signal, and improving reliability of a product with reduced error in operation.

Moreover, according to various embodiments of the present disclosure, patterns of the printed circuit board are formed such that a ground of the power line, on which the primary heat-generating elements are mounted, and a ground of the signal line, on which the control circuit is mounted, are positioned on different layers of the printed circuit board, thereby minimizing the effect of the EMI noise, transmitted through the power line, on the control signal.

DETAILED DESCRIPTION

Figure 1:
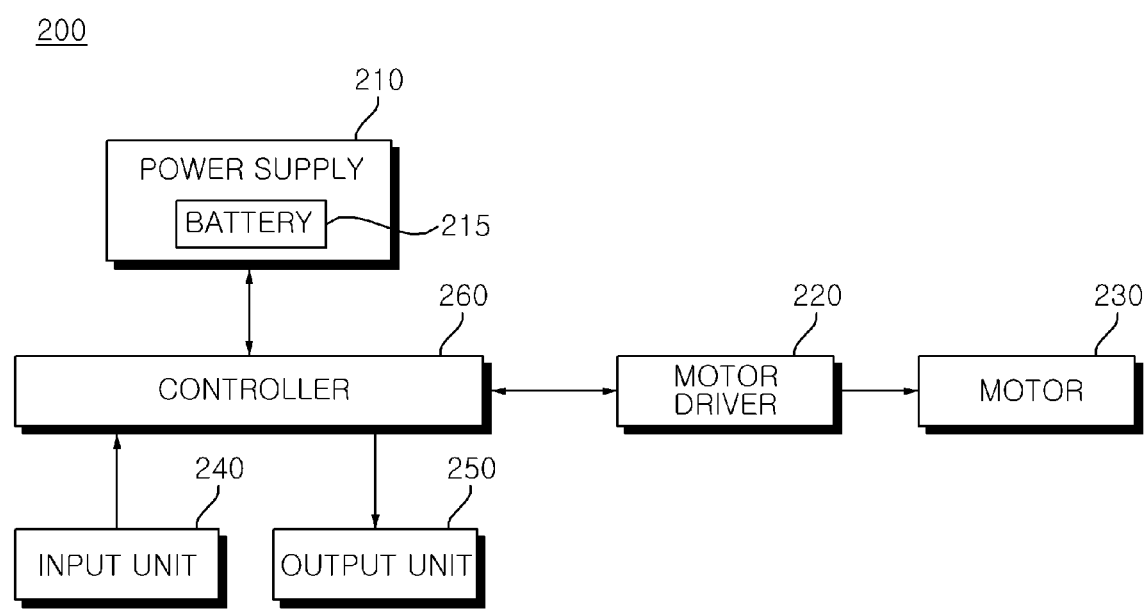
FIG. 1 is an internal block diagram illustrating a motor driving apparatus according to an embodiment of the present disclosure.

Reference will now be made in detail to the embodiments of the present disclosure, examples of which are illustrated in the accompanying drawings. To clearly and briefly describe the present disclosure, a part without concerning to the description is omitted in the drawings, and the same or like reference numerals in the specification denote the same elements.

The suffixes "module" and "unit" of elements herein are used for convenience of description and thus can be used interchangeably and do not have any distinguishable meanings or functions. Thus, the "module" and the "unit" may be interchangeably used.

Throughout this specification, the terms such as "include" or "comprise" may be construed to denote a certain characteristic, number, step, operation, constituent element, or a combination thereof, but may not be construed to exclude the existence of or a possibility of addition of one or more other characteristics, numbers, steps, operations, constituent elements, or combinations thereof.

It will be understood that, although the terms "first", "second", "third" etc. may be used herein to describe various elements, these elements should not be limited by these terms. These terms are only used to distinguish one element from another element.

FIG. 1 is an internal block diagram illustrating a motor driving apparatus according to an embodiment of the present disclosure.

Referring to FIG. 1, a motor driving apparatus 200 includes, for example, a power supply 210, a motor driver 220, a motor 230, an input unit 340, an output unit 250, and/or a controller 260.

The power supply 210 may supply power to, for example, the motor driving apparatus 200.

The power supply 210 may convert, for example, alternating current (AC) power input from a commercial AC power source to direct current (DC) power, and may supply the DC power to a power source of the motor driving apparatus 200. For example, the power supply 210 may include a converter (not shown) and may convert the AC power into the DC power by using the converter.

The power supply 210 may include, for example, a battery 215 for storing the DC power. For example, the power supply 210 may supply the DC power stored in the battery 215 to the power source of the motor driving apparatus 200.

The power supply 210 may convert, for example, commercial AC power to DC power, and may store the DC power in the battery 215.

The power supply 210 may further include a DC terminal capacitor (not shown), and may store the DC power converted by the converter and/or the DC power supplied from the battery 215 in the DC terminal capacitor.

The motor driver 220 may drive, for example, the motor 230. For example, the motor driver 220 may drive the motor 230 based on the power supplied from the power supply 210.

The motor driver 220 may include, for example, an inverter including a plurality of switching elements, and converting a DC voltage into an AC voltage and outputting the AC voltage having a predetermined frequency by switching ON/OFF the switching elements, and may supply the AC voltage, output from the inverter, to the motor 230.

The motor driver 220 may further include, for example, a current detector (not shown) to detect current flowing in each module of the motor driving apparatus 200, and/or a voltage detector (not shown) to detect a voltage applied to each module thereof.

In order to detect the current, the current detector may include, for example, a current sensor, a current transformer (CT), a shunt resistor, etc., and the detected current may be input to the controller 260.

In order to detect the voltage, the voltage detector may include, for example, a resistive element, an operational amplifier (op-amp), etc., and the detected voltage may be input to the controller 260.

The motor 230 may be driven, for example, according to the voltage supplied from the motor driver 220.

The motor 230 may be driven, for example, according to the AC voltage having a predetermined frequency which is supplied from the motor driver 220. For example, the operation of the motor 230 may vary depending on a magnitude and/or a frequency of the voltage supplied from the motor driver 220.

The motor 230 may include, for example, a Surface-Mounted Permanent-Magnet Synchronous Motor (SMPMSM), an Interior Permanent Magnet Synchronous Motor (IPMSM), a Synchronous Reluctance Motor (SynRM), and the like, among which the IPMSM is a Permanent Magnet Synchronous Motor (PMSM) using a permanent magnet, and the SynRM includes no permanent magnet.

The input unit 240 may include, for example, an input device (e.g., key, touch panel, etc.) for receiving a user's input. For example, the input unit 240 may include a power key for turning on/off the power source of the motor driving apparatus 200, an operation key for operation setting of the motor driving apparatus 200, and the like.

The input unit 240 may receive, for example, a user input through an input device, and may transmit a command, corresponding to the received user input, to the controller 260. For example, the controller 260 may determine an operation mode of the motor driving apparatus 200 based on the user input which is input from the input unit 240.

The output unit 250 may include a display device, e.g., a display (not shown), a light emitting diode (LED), and the like. For example, the output unit 250 may display an On/Off state of the power source of the motor driving apparatus 200, an operating state according to the operation mode, a message indicating the occurrence of an error, and the like.

The output unit 250 may include an audio device, e.g., a speaker, a buzzer, and the like. For example, the output unit 250 may output a sound effect according to an On/Off state of the power source of the motor driving apparatus 200, a sound effect according to a change in operation mode, a sound effect for notifying the occurrence of an error, and the like.

The controller 260 may be connected to, for example, each module of the motor driving apparatus 200. The controller 260 may transmit and receive signals to and from each module of the motor driving apparatus 200 and may control the overall operation of each module.

The controller 260 may include, for example a converter controller (not shown) for controlling the operation of a converter and/or an inverter controller (not shown) for controlling the operation of an inverter. According to various embodiments of the present disclosure, the converter controller and the inverter controller may either be provided in a single element or separately in different elements.

The controller 260 may control, for example, the operation of the motor driver 220. For example, the controller 260 may output an inverter switching control signal for controlling a switching operation of the inverter included in the motor driver 220. Here, the switching control signal may be, for example, a pulse width modulation (PWM) control signal having a predetermined duty cycle and frequency.

In addition, the motor driving apparatus 200 according to various embodiments of the present disclosure may control the operation of the motor 230 in a sensorless manner without using a position sensor, such as a Hall sensor for sensing the position of a rotor of the motor, inside or outside of the motor 230.

The controller 260 may calculate, for example, a current flowing in the motor 230. For example, the controller 260 may calculate the current flowing in the motor 230 by using the current detector.

The controller 260 may calculate, for example, a phase current flowing in the motor 230. If the motor 230 is a three-phase motor, the controller 260 may calculate a three-phase current flowing in the motor 230.

The controller 260 may calculate, for example, a rotation velocity of the motor 230. For example, the controller 260 may calculate the rotation velocity of the motor 230 based on the phase current flowing in the motor 230.

The controller 260 may calculate, for example, the position of a rotor of the motor 230. For example, the controller 260 may calculate the position of the rotor of the motor 230 based on the phase current flowing in the motor 230.

Figure 2A:
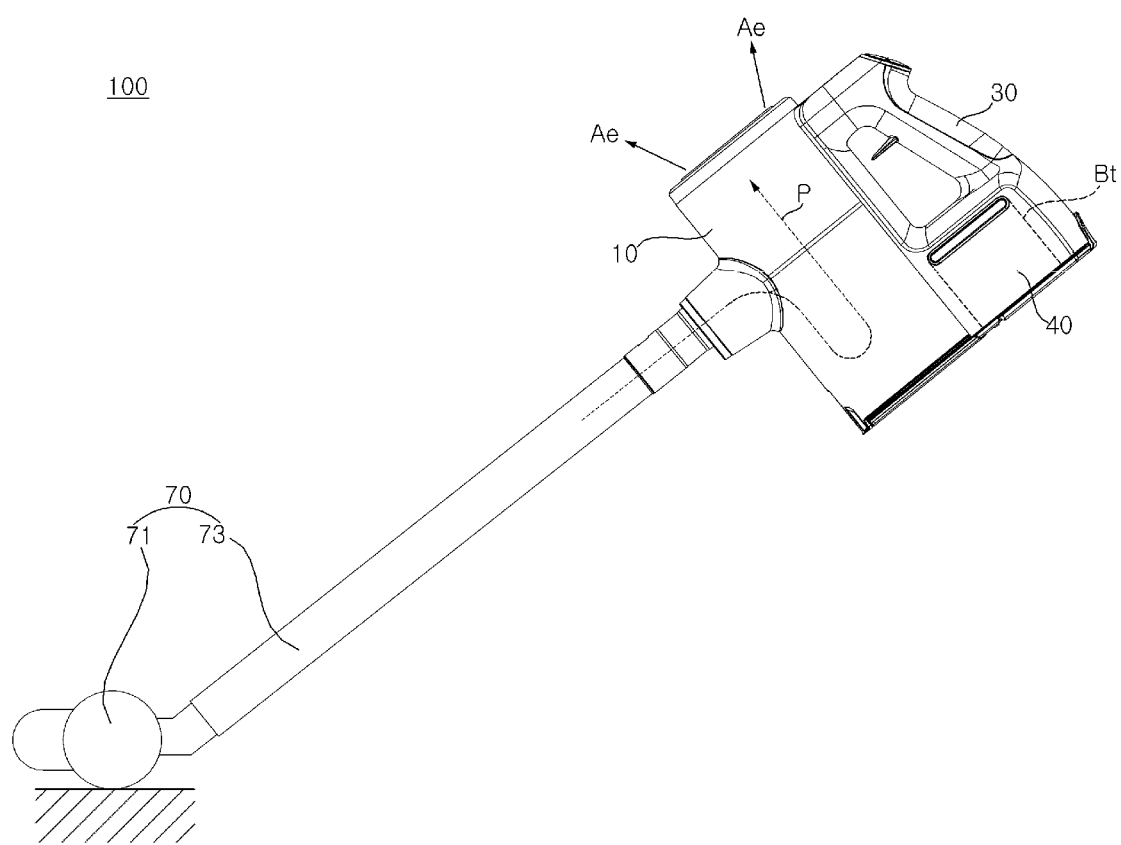
FIG. 2A is a side elevation view of a cleaner according to an embodiment of the present disclosure.
Figure 2B:
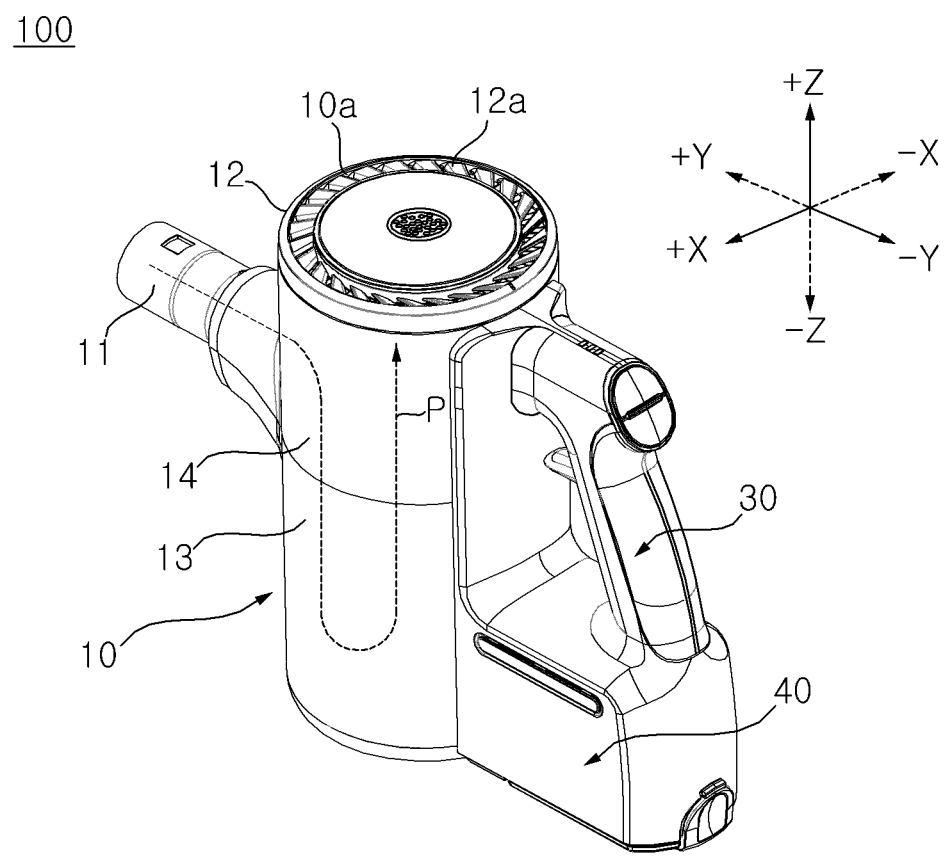
FIG. 2B is a perspective view of a cleaner, from which a nozzle module is separated.

FIG. 2A is a side elevation view of a cleaner according to an embodiment of the present disclosure; FIG. 2B is a perspective view of a cleaner, from which a nozzle module is separated; and FIG. 2C is a side cross-sectional view of the cleaner of FIG. 2B.

Figure 2C:
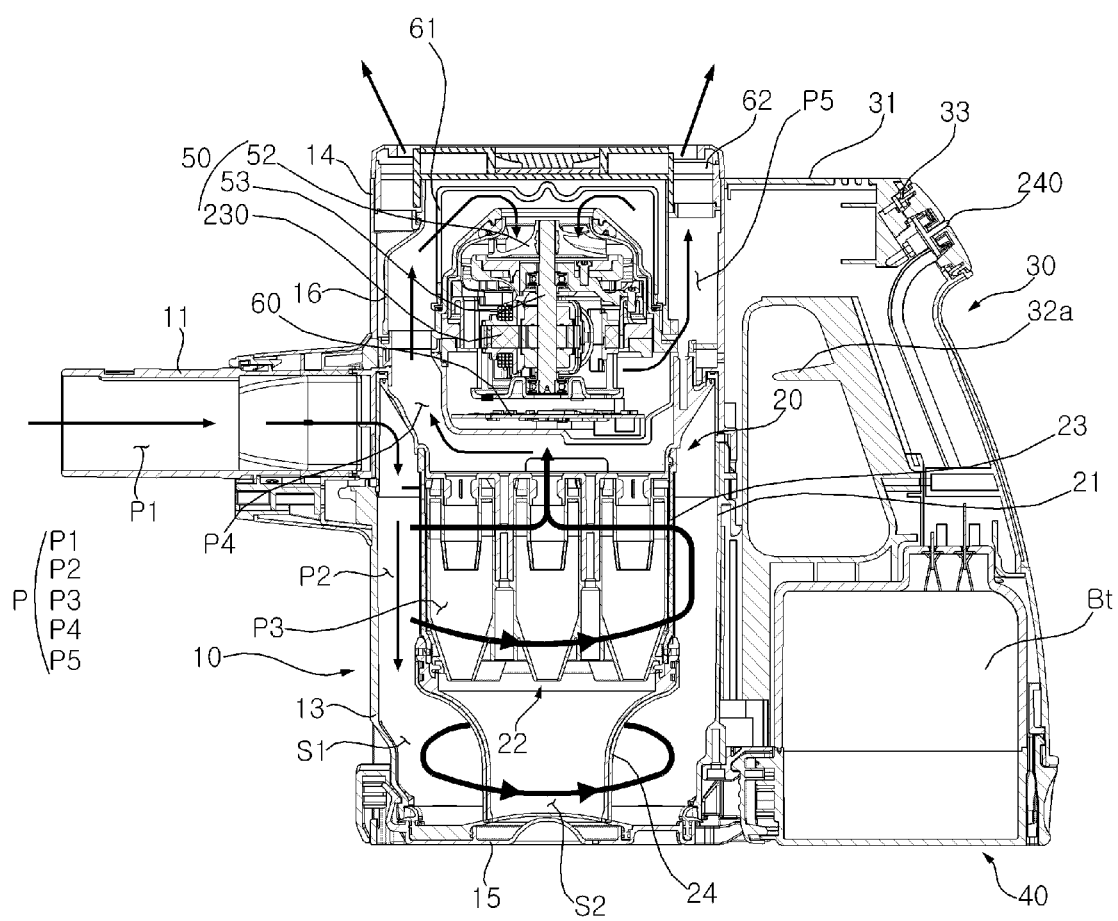
FIG. 2C is a side cross-sectional view of the cleaner of FIG. 2B.

Referring to FIGS. 2A and 2C, the cleaner 100 according to an embodiment of the present disclosure includes, for example: a main body 10 having a flow path P for guiding suctioned air to be discharged to the outside; a handle 30 connected to a rear side of the main body 10; a nozzle module 70 detachably connected to a suction part 11 of the main body 10; a battery Bt (e.g., the battery 215 of FIG. 1) for supplying power; a battery housing 40 in which the battery Bt is accommodated; and/or a fan module 50 disposed on the flow path P to move air in the flow path P.

The nozzle module 70 includes, for example, a nozzle 71 provided to suction outside air, and an extension pipe 73 elongated from the nozzle 71.

The extension pipe 73 may connect, for example, the nozzle 71 and the suction part 11. The extension pipe 73 may guide, for example, air suctioned by the nozzle 71 to flow into the flow path P. An end of one side of the extension pipe 73 may be, for example, detachably connected to the suction part 11 of the main body 10. A user may clean the floor by moving the nozzle 71, placed on the floor, while holding the handle 30.

The main body 10 includes, for example a discharge cover 12 having an exhaust port 10*a*, a dust collector 13 for storing separated dust, and/or a fan module housing 14 in which the fan module 50 is accommodated.

The discharge cover 12 may form, for example, an upper surface of the main body 10, and may cover an upper portion of the fan module housing 14.

The dust collector 13 may have, for example, a cylindrical shape. The dust collector 13 may be disposed, for example, at a lower side of the fan module housing 14. In this arrangement, dust storage spaces S1 and S2 may be formed inside the dust collector 13. For example, the first storage space S1 may be formed between the dust collector 13 and a dust flow guide 24, and the second storage space S2 may be formed in the dust flow guide 24.

The fan module housing 14 may extend upward, for example, from the dust collector 13. The fan module housing 14 may have, for example, a cylindrical shape.

The fan module 50 may be disposed in the fan module housing 14. The main body 10 may include, for example, a dust cover 15 provided to open and close the dust collector 13. The dust cover 15 may be rotatably connected to, for example, a lower side of the dust collector 13. The dust cover 15 may open and close the lower side of the dust collector 13, for example, by rotation. The dust cover 15 includes, for example, a hinge (not shown) for rotation. The hinge may be coupled to, for example, the dust collector 13. For example, the dust cover 15 may open and close the first storage space S1 and the second storage space S2 together.

The main body 10 includes, for example, an air guide 16 for guiding air discharged from the dust separator 20. The air guide 16 may include, for example, a fan module flow path P4 for guiding air from the dust separator 20 to an impeller 52. The air guide 16 may include, for example, exhaust flow paths P5 and P5' for guiding air, passing through the impeller 52, to the exhaust port 10a. The air guide 16 may be disposed, for example, in the fan module housing 14.

For example, the air guide 16 may form the flow paths P4 and P5, so that after air discharged from the dust separator 20 moves up, the air moves down while passing through the impeller 52, and then moves up again to the exhaust port 10a.

The main body 10 includes, for example, the exhaust port 10a, through which air in the flow path P is discharged to the outside of the main body 10. The discharge port 10a may be formed at, for example, the discharge cover 12.

For example, the exhaust port 10a may be disposed to face a specific direction (e.g., upward direction). A plurality of exhaust ports 10a may be divided by, for example, a plurality of exhaust guides 12a in a circumferential direction. For example, the plurality of exhaust ports 10a may be spaced apart from each other for at predetermined intervals in the circumferential direction.

The handle 30 may extend, for example, in an up-down direction and may include an additional extension part 32. For example, the additional extension part 32 may be spaced apart from the main body 10 in a front-rear direction. A user may use the cleaner 100a while holding the additional extension part 32. An upper end of the additional extension part 32 may be connected to, for example, a rear end of an extension part 31. A lower end of the additional extension part 32 may be connected to, for example, the battery housing 40.

The additional extension part 32 may include, for example, a movement restriction part 32a for preventing a user's hand, holding the additional extension part 32, from moving in a longitudinal direction (up-down direction) of the additional extension part 32. For example, the movement restriction part 32a may protrude forward from the additional extension part 32.

For example, the movement restriction part 32a may be vertically spaced apart from the extension part 31. While holding the additional extension part 32, the user may place some of the fingers of the hand, holding the additional extension part 32, on an upper portion of the movement restriction part 32a, and the other fingers on a lower portion of the movement restriction part 32a.

The handle 30 may include, for example, an inclined surface 33 facing toward a space between an upper side and a rear side thereof. The inclined surface 33 may be disposed, for example, on a rear surface of the extension part 31. The input unit 3 may be disposed, for example, on the inclined surface 33.

For example, the battery Bt may supply power to the fan module 50. The battery Bt may supply power to, for example, a noise control module. The battery Bt may be detachably mounted in, for example, the battery housing 40.

The battery housing 40 may be connected, for example, to a rear side of the main body 10. The battery housing 40 may be disposed, for example, at a lower side of the handle 30. The battery Bt may be accommodated, for example, in the battery housing 40. The battery housing 40 may include, for example, a heat-dissipating hole for discharging heat generated in the battery Bt to the outside.

The fan module 50 may include, for example, the impeller 52 and a suction motor 230 for rotating the impeller 52. The fan module 50 may include, for example, a shaft 53 fixed at the center of the impeller 52. In this case, the shaft 53 may serve as a motor shaft of the motor 230. The fan module 50 will be described later with reference to FIGS. 3A and 3B.

The cleaner 100 may include, for example, a printed circuit board (PCB) 60 for controlling the motor 230. The PCB 60 may be disposed, for example, between the motor 230 and the dust separator 20. In this case, the motor driver 220 included in the motor driving apparatus 200 may include, for example, circuit elements disposed on the PCB 60.

The cleaner 100 may include, for example, a pre-filter 61 for filtering air before air is drawn into the motor 230. For example, the pre-filter 61 may be disposed to surround the impeller 52. Air on the fan module flow path P4 may pass through, for example, the pre-filter 61 to reach the impeller 52. The pre-filter 61 is disposed in the main body 10. The pre-filter 61 may be disposed below the discharge cover 12. By separating the discharge cover 12 from the cleaner 100, a user may withdraw the pre-filter 61 from the inside of the main body 10.

The cleaner 100 may include a HEPA filter 62 for filtering air before air is discharged through the exhaust port 10a. After passing through the impeller 52, the air may pass through the HEPA filter 62, to be discharged to the outside through the exhaust port 10a. The HEPA filter 62 is disposed on the exhaust flow path P5.

The discharge cover 12 may include, for example, a filter accommodating space for accommodating the HEPA filter 62. For example, the filter accommodating space has a lower side, which is open so that the HEPA filter 62 may be accommodated in the filter accommodating space through the lower side of the exhaust cover 12.

For example, the exhaust port 10a may be formed to face the HEPA filter 62. The HEPA filter 62 may be disposed, for example, at a lower side of the exhaust port 10a. The HEPA filter 62 may extend, for example, along the exhaust port 10a in a circumferential direction.

The dust separator 20 may include a first cyclone part 21 and a second cyclone part 22 which may separate dust by, for example, using cyclonic flow. The flow path P2 formed by the first cyclone part 21 may be connected to, for example, the flow path P1 formed by the suction part 11. For example, air and dust, suctioned through the suction part 11, may helically flow along an inner peripheral surface of the first cyclone part 21. The second cyclone part 22 may be disposed, for example, in the first cyclone part 21. The second cyclone part 22 may be disposed, for example, in a boundary part 23. The second cyclone part 22 may include a plurality of cyclone bodies which are, for example, arranged in parallel. In addition, the dust separator 20 may include, for example, a single cyclone part.

Air and dust, suctioned through the suction flow path P1 by the operation of the motor 230, may be separated from each other while flowing in the flow path P2 formed by the first cyclone part 21 and the flow path P3 formed by the second cyclone part 22. Air in the flow path P2 formed by the second cyclone part 22 may move upward, to be drawn into the fan module flow path P2. The fan module flow path P4 may guide the air toward, for example, the pre-filter 61.

After sequentially passing through the pre-filter 61 and the impeller 52, the air may be introduced into, for example, the exhaust flow path P5, and then may pass through the HEPA filter 62 to be discharged to the outside through the exhaust port 10a.

Figure 3:
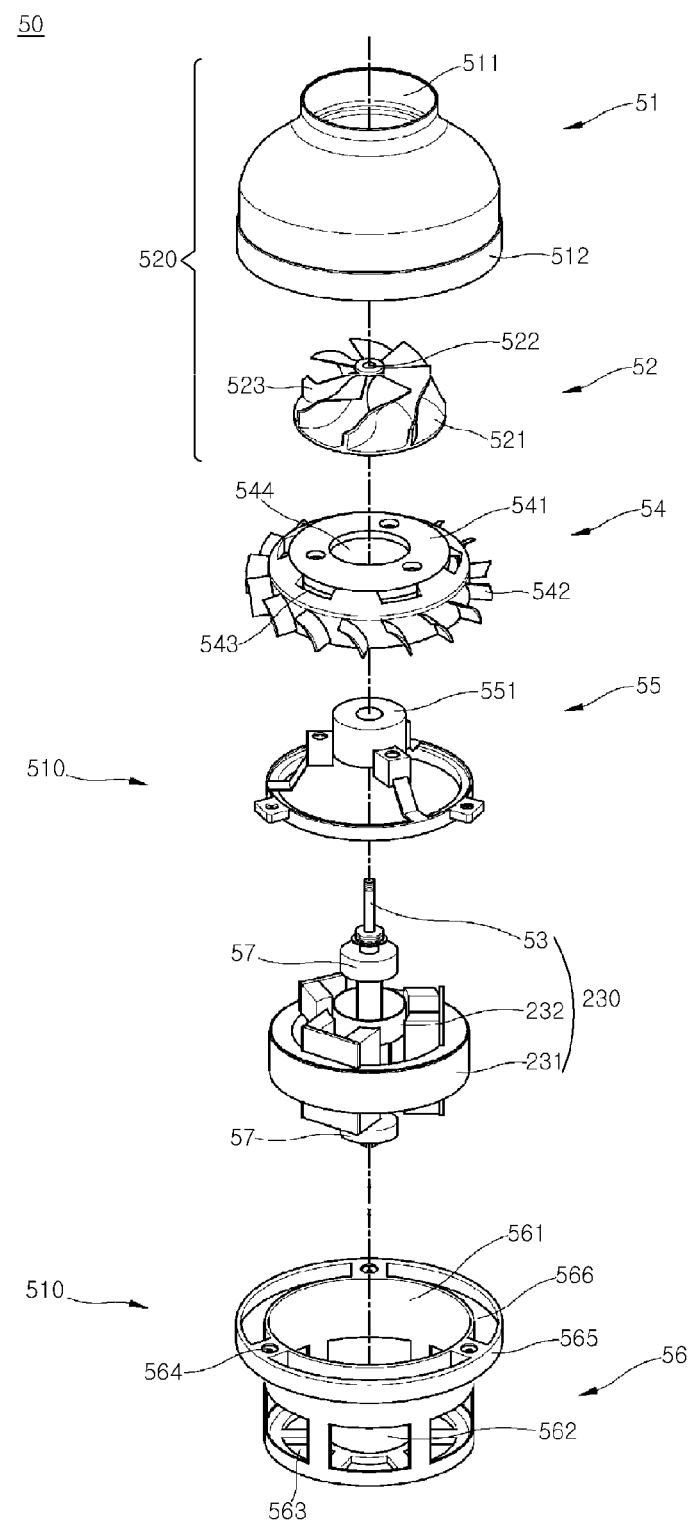
FIG. 3 is an extended perspective view of a fan module provided for a cleaner according to an embodiment of the present disclosure.

FIG. 3 is an extended perspective view of a fan module provided for a cleaner according to an embodiment of the present disclosure.

Referring to FIG. 3, the fan module 50 may include, for example, the motor 230; a motor body 510 in which the motor 230 is accommodated; an airflow generator 520 disposed above the motor body 510 and generating an airflow; and/or a diffuser 52 for diffusing the airflow generated by the airflow generator 520.

The motor 230 may include: a ring-shaped stator 231; the shaft 53 passing through the center of the stator 231; and a rotor 232 axially mounted on the shaft 53 and generating torque using the stator 231. While FIG. 3 illustrates an example in which the motor 230 is a brushless direct current (BLDC) motor, and the stator 231 is disposed outside of the rotor 232, this should not be construed as excluding a motor having the stator 231 positioned inside of the rotor 232.

The motor body 510 may include, for example, a motor housing 56 accommodating the motor 230 and including a body connecting part 565 for fixing an impeller cover 51; and a bearing housing 55 fixed to an upper portion of the motor housing 56 and supporting a bearing 57 installed at the upper portion of the motor 230.

The motor housing 56 may include, for example, a motor installing part 561, in which the motor 230 is embedded and which has a cylindrical shape with an open upper portion, and a bearing support 562 fixedly supporting the bearing 57 installed at a lower portion of the motor 230.

A side wall of the motor installing part 561 may be formed in, for example, a cylindrical shape, and the stator 231 may be fixed to an inner surface of the side wall.

At an upper end of the side wall of the motor installing part 561, there are included, for example, a connecting arm 564 extending outward from the side wall in a radial direction, and the body connecting part 565 provided at an outer end in a radial direction of the connecting arm 564. FIG. 3 illustrates an example in which three connecting arms 564 are arranged at intervals of 120 degrees.

While the motor 230 is accommodated in the motor housing 56, the bearing housing 55 may be disposed above the motor housing 56.

The bearing housing 55 may have, for example, a structure for supporting the bearing 57 installed at the upper portion of the motor 230. For example, with respect to the rotor 232, a lower end of the shaft 53 may be supported by the motor housing 56 and an upper end of the shaft 53 may be supported by the bearing housing 55.

At the center of the bearing housing 55, there is provided the bearing support 551 for supporting the bearing 57 installed at the upper end of the shaft 53. The bearing support 551 may include, for example, a hole having a hollow cylindrical shape with an open lower portion, and an upper central portion through which the shaft 53 passes. For example, the bearing 57 may be inserted into the inside of the bearing support 551 from a lower side thereof.

The diffuser 54 may be disposed, for example, at an upper side of the bearing housing 55. The diffuser 54 may include, for example, a diffuser body 541 defining an exterior of the diffuser 54, and a vane 542 provided at an outer surface of the diffuser body 541.

The diffuser body 41 may include, for example, a hole 544 formed at a central portion thereof, and a flat part 541 having a flat shape.

For example, the impeller 52 may be disposed on an upper portion of the flat part 541, and the bearing housing 55 may be disposed at a lower portion of the flat part 541.

The vane 542 may guide a flow direction of air, flowing through the impeller 52, toward an air outlet 566 or an auxiliary air outlet 563. In FIG. 3, the air outlet 566 is provided at an upper portion of the motor housing 56, and the vane 542 is provided at the diffuser 54 disposed above the air outlet 566.

The diffuser 40 may include, for example, a plurality of cooling flow path outlets 543 formed along a circumference thereof. The cooling flow path outlets 543 may be formed, for example, closer to the impeller 52 than to the vane 542. The cooling flow path outlets 543 may be disposed, for example, closer to an air discharge side of the impeller 52.

The impeller 52 may be disposed, for example, at an upper portion of the diffuser 54. An axial mounting hole 522, into which the shaft 53 is inserted in an up-down direction, is formed through the center of the impeller 52.

An impeller body 521 may include, for example, an inclined surface which is inclined downward away from the center of rotation in a radial direction. That is, the impeller 52 according to the embodiment of the present disclosure may be a mixed-flow impeller. For example, a plurality of blades 523 for pressing air may be radially formed at an upper portion of the impeller body 521.

The impeller cover 51 may be formed, for example, to cover the top of the motor body 510. At an upper central portion of the impeller cover 51, there is formed, for example, an air inlet 511 through which air is sucked into the fan module 50.

The fan module 50 may draw air in through, for example, the air inlet 511 provided at the upper central portion of the impeller cover 51, and may discharge the air through a space formed between a lower end of the impeller cover 51 and the motor installing part 561, i.e., the air outlet 566 provided on an upper circumference of the motor housing 56 and/or the auxiliary air outlet 563 provided at a lower portion of the motor housing 56.

Figure 4:
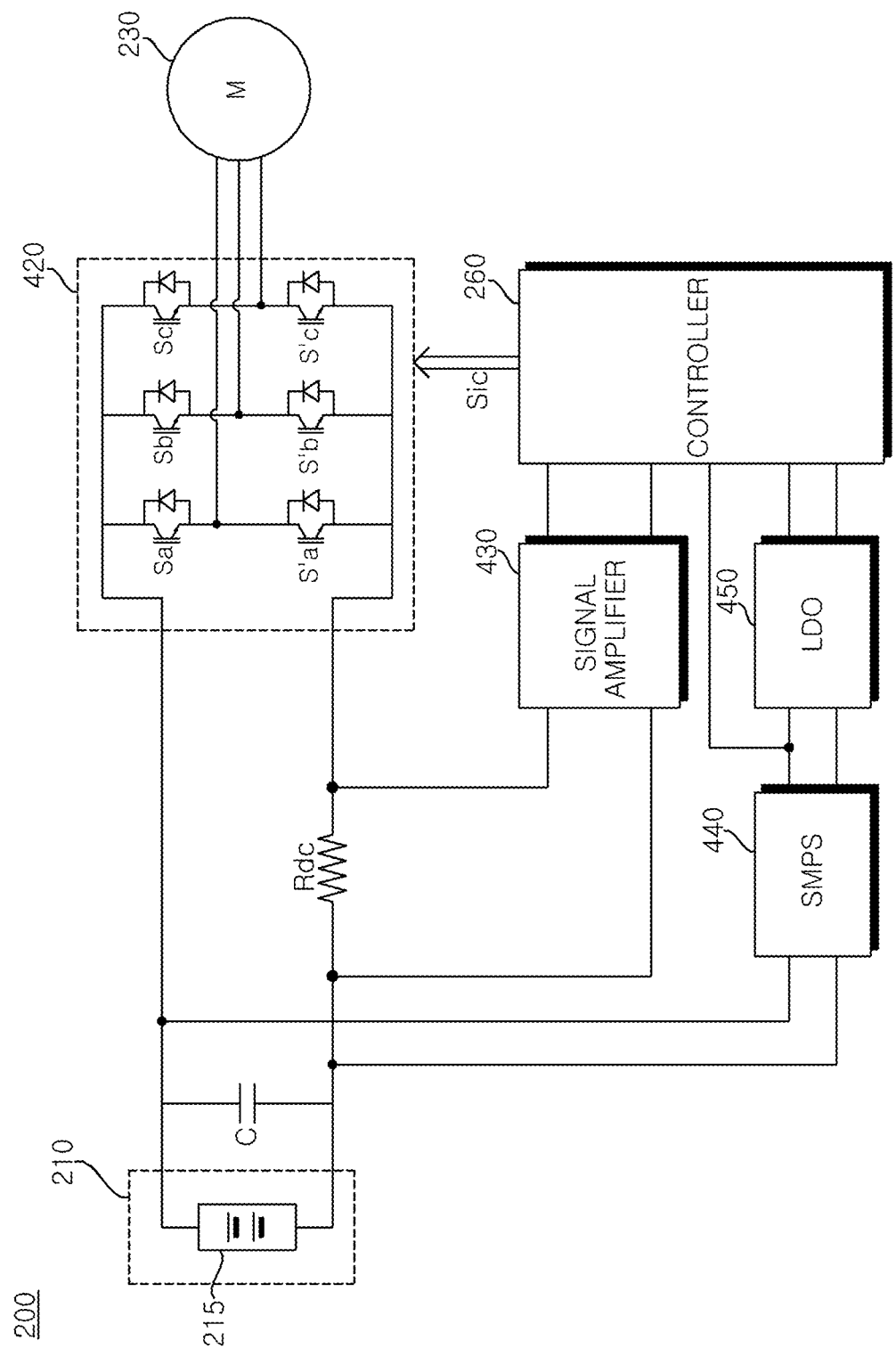
FIG. 4 is an internal circuit diagram illustrating a motor driving apparatus according to an embodiment of the present disclosure.

FIG. 4 is an internal circuit diagram illustrating a motor driving apparatus according to an embodiment of the present disclosure.

Referring to FIG. 4, the motor driving apparatus 200 includes the battery 215, the DC terminal capacitor C connected to the battery 215, an inverter 420, a DC terminal resistive element Rdc disposed between the DC terminal capacitor C and the inverter 420, a signal amplifier 430, a voltage generator 440, a voltage dropper 450, and/or the controller 260.

The DC terminal capacitor C may store, for example, the direct current (DC) power supplied from the battery 215. In FIG. 4, a single element is provided as the DC terminal capacitor C, but the present disclosure is not limited thereto, and a plurality of elements may be provided to ensure device stability.

The inverter 420 may be connected to, for example, the DC terminals, which are both ends of the DC terminal capacitor C, may convert the DC voltage into the AC voltage, and may output the AC voltage to the motor 230.

The inverter 420 may include, for example, a plurality of switching elements Sa, S'a, Sb, S'b, Sc, and S'c, may convert the DC voltage Vdc smoothed by on/off operation of the switching elements into three-phase AC voltages having a predetermined frequency, and may output the three-phase AC voltages to the motor 230.

The inverter 420 includes, for example, upper arm switching elements Sa, Sb, and Sc and lower arm switching elements S'a, S'b, and S'c, each pair of an upper arm switching element and a lower arm switching element being connected in series, and three pairs of upper and lower arm switching elements Sa and S'a, Sb and S'b, and Sc and S'c being connected in parallel. Diodes may be connected in anti-parallel to the respective switching elements Sa, S'a, Sb, S'b, Sc, and S'c.

The switching elements Sa, S'a, Sb, Sb, Sc, and S'c of the inverter 420 may perform an on/off operation based on, for example, a switching signal Sic output from the controller 260.

The signal amplifier 430 may be connected to, for example, both ends of the DC terminal resistive element Rdc disposed between the DC terminal capacitor C and the inverter 420. The signal amplifier 430 may generate a signal based on, for example, a current flowing in the DC terminal resistive element Rdc and may transmit the generated signal to the controller 260.

The signal amplifier 430 may amplify, for example, voltages at both ends of the DC terminal resistive element Rdc, and may output the amplified voltages. To this end, the signal amplifier 430 may include, for example, at least one amplifier. For example, the signal amplifier 430 may include at least one op-amp.

The voltage generator 440 may be connected to, for example, the DC terminal capacitor C, and may output voltages of various magnitudes (e.g., 5V, 7.5V, 10V, 15V, etc.) required by various modules included in the motor driving apparatus 200.

The voltage generator 440 may include, for example, a switching mode power supply (SMPS).

The voltage dropper 450 may be connected to, for example, the voltage generator 440, and may drop an input voltage and output the dropped voltage. The voltage dropper 450 may include, for example, a linear regulator (LDO). For example, the voltage dropper 450 may drop a voltage of 15V, output from the voltage generator 440, to 3.3V and may output the dropped voltage.

The controller 260 may be connected to, for example, each module of the motor driving apparatus 200. For example, the controller 260 may transmit and receive signals to and from each module of the motor driving apparatus 200, and may control the overall operation of each module of the motor driving apparatus 200. For example, the controller 260 may be referred to as a microcontroller unit (MCU), Micom, and the like.

The controller 260 may output, for example, an inverter switching control signal Sic for controlling a switching operation of the inverter 420. The controller 260 may generate the inverter switching control signal Sic based on, for example, voltages at both ends of the DC terminal capacitor and/or an output current flowing in the DC terminal resistive element Rdc. The inverter switching control signal Sic may be, for example, a pulse width modulation (PWM) control signal.

The controller 260 may include, for example, a gate driver (not shown). For example, based on the inverter switching control signal Sic output by the controller 260, the gate driver may generate a gate drive signal Si, and may output the generated gate drive signal Si to each of the plurality of switching elements Sa, S'a, Sb, S'b, Sc, and S'c included in the inverter 420.

In this case, the plurality of switching elements Sa, S'a, Sb, S'b, Sc, and S'c of the inverter 420 may perform switching operation.

An increase in the capacity of the inverter 420 may cause excessive heat generation of the circuit elements, thereby deteriorating performance of the cleaner 100.

For example, the switching elements Sa, S'a, Sb, S'b, Sc, and S'c of the inverter 420 and the DC terminal resistive element Rdc are connected to a power line in which a current at a high level flows. Accordingly, as the capacity of the inverter 420 increases, excessive heat generation of these elements may be caused compared to other elements. In this case, the switching elements Sa, S'a, Sb, Sb, Sc, and S'c of the inverter 420 and the DC terminal resistive element Rdc may be referred to as primary heat generating elements.

Further, as a rotation velocity of the motor 230 increases to improve performance of the cleaner 100, excessive heat generation of elements, such as the MCU, the gate driver, SMPS, and LDO, may also be caused. In this case, the elements, such as the MCU, the gate driver, SMPS, and LDO, may be referred to as secondary heat generating elements.

The motor driving apparatus 200 and the cleaner 100 including the same according to various embodiments of the present disclosure may effectively dissipate heat of the heat generating elements, mounted in the printed circuit board 600, through air flowing by the fan module 50.

Figure 5A:
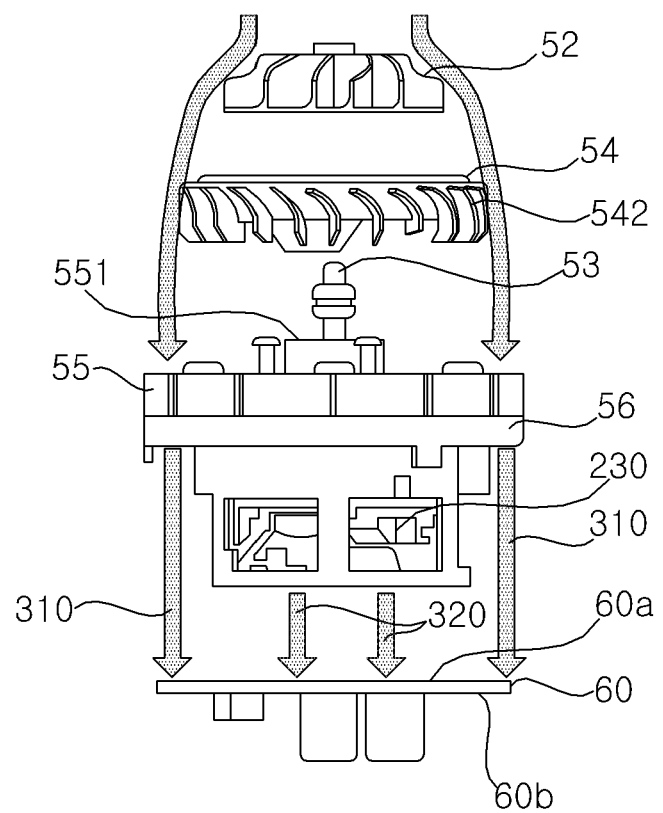
FIG. 5A is a diagram referred to in explaining an arrangement of a fan module and a printed circuit board according to an embodiment of the present disclosure.
Figure 5B:
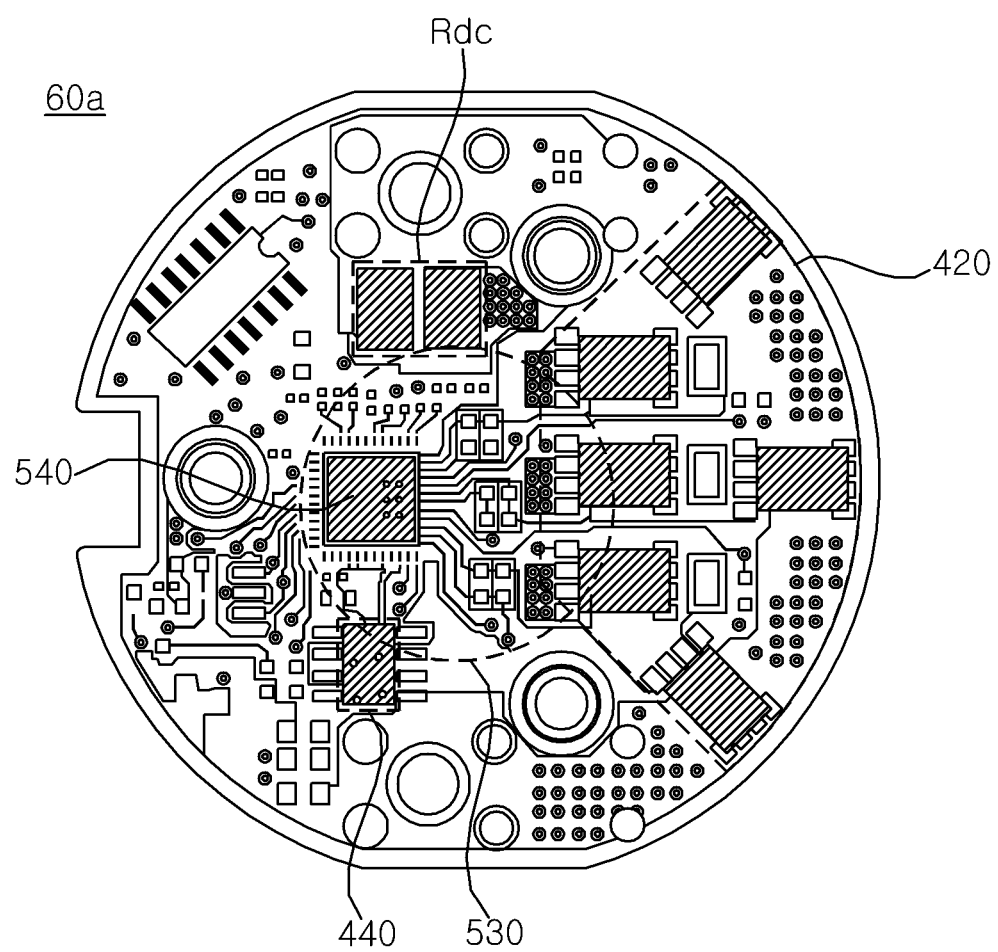
FIG. 5B is a diagram illustrating an example of one surface of the printed circuit board of FIG. 5A.
Figure 5C:
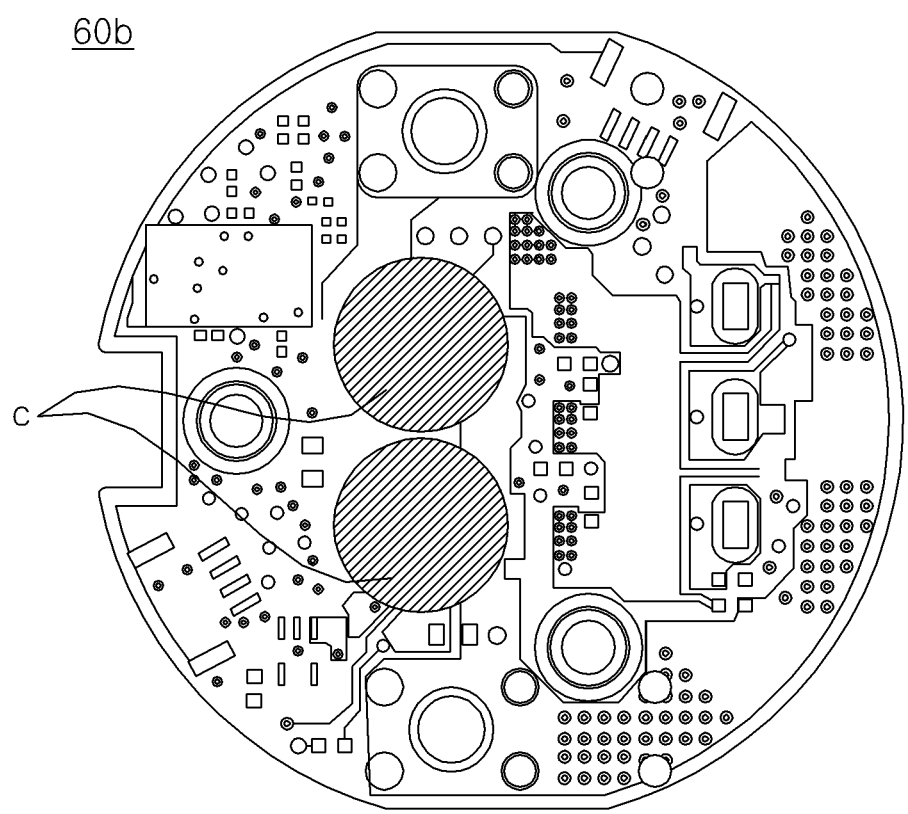
FIG. 5C is a diagram illustrating an example of the other surface of the printed circuit board of FIG. 5A.

FIG. 5A is a diagram referred to in explaining an arrangement of a fan module and a printed circuit board according to an embodiment of the present disclosure; FIG. 5B is a diagram illustrating an example of one surface of the printed circuit board of FIG. 5A; and FIG. 5C is a diagram illustrating an example of the other surface of the printed circuit board of FIG. 5A.

Referring to FIG. 5A, the impeller 52 may rotate, for example, with rotation of the motor 230, and air flowing through the impeller 52 may be discharged by the vane 542 of the diffuser 54 through the air outlet 56 and the auxiliary air outlet 563 provided at a lower portion of the motor housing 56.

In this case, an amount of air 310 discharged through the air outlet 566 may be greater than, for example, an amount of air 320 discharged through the auxiliary air outlet 563.

Further, the printed circuit board 60 for controlling the motor 230 may be disposed, for example, adjacent to the fan module 50. For example, the printed circuit board 60 may be disposed adjacent to the motor housing 56. In this case, the air discharged through the air outlet 566 and/or the auxiliary air outlet 563 may be discharged toward one surface 60a of the printed circuit board 60. The surface 60a may be referred to as a first surface of the printed circuit board 60.

Referring to FIGS. 5B and 5C, for example, elements included in the motor driving apparatus 200 may be mounted in the printed circuit board 60.

On the one surface 60a of the printed circuit board 60, there may be mounted, for example, heat generating elements which generate heat by the operation of the motor 230 among the circuit elements included in the motor driving apparatus 200, and other elements may be mounted on the other surface 60b of the printed circuit board 60. The surface 60b may be referred to as a second surface of the printed circuit board 60.

For example, the primary heat generating elements, such as the switching elements Sa, S'a, Sb, S'b, Sc, and S'c of the inverter 420 and the DC terminal resistive element Rdc, which are connected to a power line, may be mounted on the one surface 60a of the printed circuit board 60. Furthermore, the secondary heat generating elements, such as the MCU, the gate driver, SMPS, and LDO, may also be mounted on the one surface 60a of the printed circuit board 60.

In this case, the elements mounted on the one surface 60a of the printed circuit board 60 may be mounted in consideration of air discharged by the fan module 50.

For example, the primary heat generating elements, such as the switching elements Sa, S'a, Sb, S'b, Sc, and S'c of the inverter 420 and the DC terminal resistive element Rdc, which are connected to a power line and in which a current at a level greater than or equal to a predetermined level flows, may be mounted at a position corresponding to a position of the air outlet 566 on the one surface 60a of the printed circuit board 60.

Here, a current flowing in the primary heat generating elements may be a current of 25 A or higher, and a current flowing in a control circuit 540 for controlling the operation of the inverter 420 may be a low-level current of several mA.

In this case, an area corresponding to the position of the air outlet 566 on the one surface 60a of the printed circuit board 60 may indicate, for example, an area within a predetermined distance (e.g., 70% to 80% of a radius of the printed circuit board 60) from the edge of the one surface 60a of the printed circuit board 60. In the present disclosure, the area corresponding to the position of the air outlet 566 may be referred to as a first area.

As illustrated herein, the area corresponding to the position of the air outlet 566 may be an area between the edge of the one surface 60a of the printed circuit board 60 and a predetermined boundary line 530.

The secondary heat generating elements may be mounted, for example, in an area corresponding to the position of the auxiliary air outlet 563 on the one surface 60a of the printed circuit board 60. For example, the control circuit 540 for controlling the operation of the inverter 420 may be mounted in the area corresponding to the position of the auxiliary air outlet 563. Here, the control circuit 540 may include, for example, the MCU, the gate driver, and/or the signal amplifier 430.

As illustrated herein, the area corresponding to the position of the auxiliary air outlet 563 may be an area within the predetermined boundary line 530 on the one surface 60a of the printed circuit board 60, i.e., a remaining area other than the area corresponding to the position of the air outlet 566.

In the present disclosure, the remaining area other than the area corresponding to the position of the air outlet 566 may be referred to as a second area.

In addition, the mounting position of the secondary heat generating elements is not limited to the illustrated example, and the secondary heat generating elements may be mounted on the one surface 60a of the printed circuit board 60, as long as the mounting position of the secondary heat generating elements may be distinguished from the power line at the mounting position of the primary heat generating elements.

The DC terminal capacitor C may be mounted, for example, on the other surface 60b of the printed circuit board 60.

As described above, according to various embodiments of the present disclosure, by mounting the heat generating elements on the one surface 60a of the printed circuit board 60 in consideration of a flow direction of the air flowing through the impeller 52, heat generated by the heat generating elements may be effectively dissipated through air.

FIGS. 6A to 6E are diagrams referred to in explaining a plurality of layers of a printed circuit board according to an embodiment of the present disclosure.

Figure 6A:
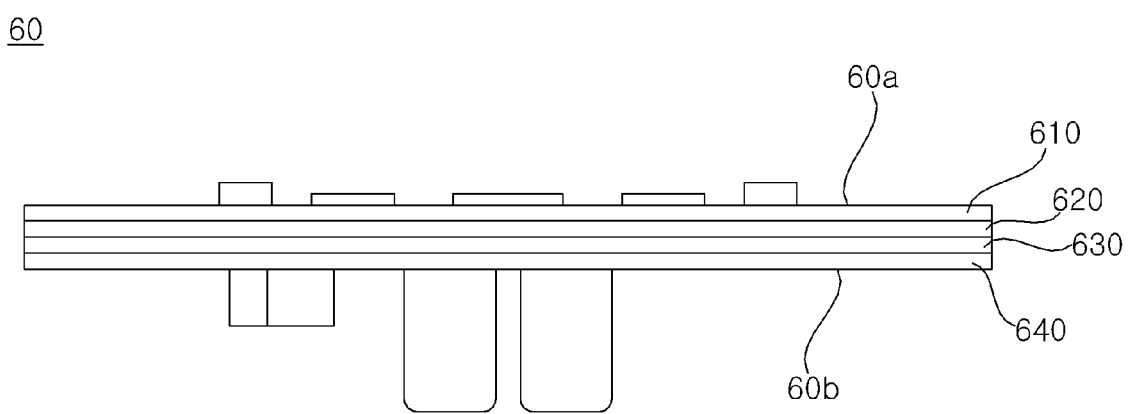
FIGS. 6A to 6E are diagrams referred to in explaining a plurality of layers of a printed circuit board according to an embodiment of the present disclosure.

Referring to FIG. 6A, the printed circuit board 60 may have, for example, a stacked structure, in which a plurality of layers 610 to 640 are stacked in a predetermined order.

The plurality of layers 610 to 640 may include, for example, a plurality of patterns. Here, the patterns may refer to, for example, copper foil patterns in which a copper conductor is printed on each of the layers 610 to 640.

For example, each of the plurality of layers 610 to 640 may include: an input pattern, through which DC power supplied to the printed circuit board 60 is input; an output pattern, through which the DC power supplied to the printed circuit board 60 is output; a power line pattern, through which a current, being greater than or equal to a predetermined level and flowing from the input pattern to the output pattern, is delivered; and/or a signal line pattern, through which a control signal is transmitted.

Here, the input pattern and the output pattern may be connected to one end and the other end of the battery 215, respectively, and the DC power supplied from the battery 215 may be input through the input pattern, may pass through the power line pattern to be output through the output pattern, and then may be transmitted to the battery 215 again.

The input pattern and the output pattern may be formed, for example, adjacent to the edge of the printed circuit board 60.

The power line pattern may be formed, for example, along the edge of the printed circuit board 60, to connect the input pattern and the output pattern.

The signal line pattern may be formed, for example, in an area other than the input pattern, the output pattern, and the power line pattern.

Furthermore, the signal line pattern, included in each of the plurality of layers 610 to 640, may be disconnected from, for example, the power line pattern included in each of the plurality of layers 610 to 640.

The plurality of layers 610 to 640 may be electrically connected to each other through a via hole (not shown) or a through hole which is provided for electric connection between the layers.

For example, each of the patterns of the plurality of layers 610 to 640 may be electrically connected to each other through the via hole.

The plurality of layers 610 to 640 may be composed of the layers 610 and 640, referred to as first and second outer layers 610 and 640, and the layers 620 and 630 referred to as first and second inner layers 620 and 630.

For example, heat-generating elements, which generate heat as the motor 230 operates, among the circuit elements included in the motor driving apparatus 200 may be mounted on the first outer layer 610, and other elements may be mounted on the second outer layer 640.

As a rotation velocity of the motor 230 increases to improve performance of the cleaner 100, a switching frequency of the switching elements Sa, S'a, Sb, S'b, Sc, and S'c increases, and electromagnetic interference (EMI) noise, which is generated by the turn-on/off of the switching elements Sa, S'a, Sb, S'b, Sc, and S'c, may degrade the performance of the cleaner 100.

However, in the motor driving apparatus 200 and the cleaner 100 including the same according to various embodiments of the present disclosure, the patterns are included in each of the plurality of layers 610 to 640 of the printed circuit board 60, thereby reducing the effect of EMI noise on the control signal.

Figure 6B:
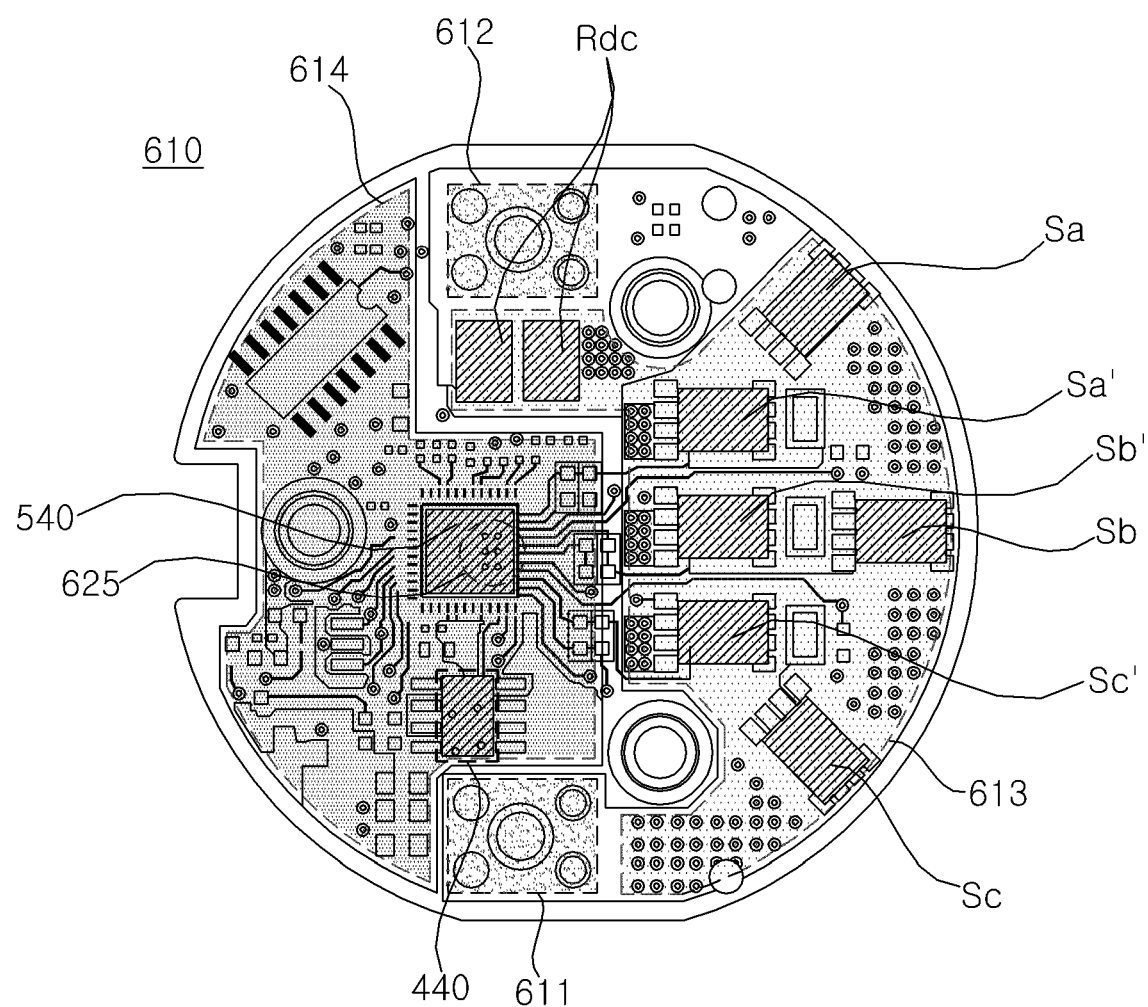

Referring to FIG. 6B, the input pattern 611, the output pattern 612, and the power line pattern 613 of the first outer layer 610 may be, for example, electrically connected to each other.

The signal line pattern 614 of the first outer layer 610 may be electrically disconnected on the first outer layer 610 from, for example, the input pattern 611, the output pattern 612, and the power line pattern 613 of the first outer layer 610.

Further, at least any one of the input pattern 621 and the output pattern 622 of the first inner layer 620 may be electrically disconnected on the first inner layer 620 from, for example, the power line pattern 623 of the first inner layer 620.

Figure 6C:
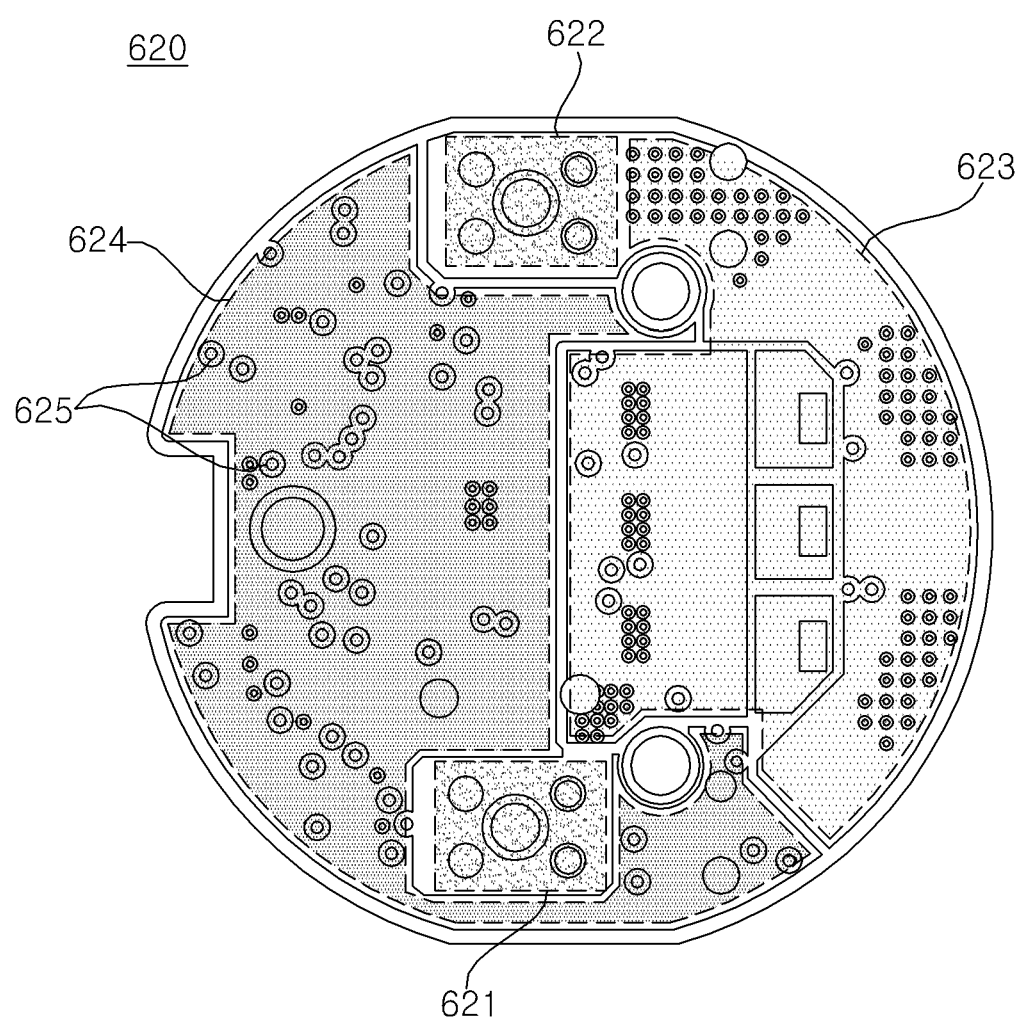

Referring to FIG. 6C, the output pattern 622 and the power line pattern 623 of the first inner layer 620 may be, for example, electrically connected to each other.

The input pattern 621 of the first inner layer 620 may be electrically disconnected on the first inner layer 620 from, for example, the output pattern 622 and the power line pattern 623 of the first inner layer 620.

The signal line pattern 624 of the first inner layer 620 may be electrically disconnected on the first inner layer 620 from, for example, the input pattern 621, the output pattern 622, and the power line pattern 623 of the first inner layer 620.

In addition, at least any one of the input pattern 631 and the output pattern 632 of the second inner layer 630 may be electrically disconnected on the second inner layer 630 from, for example, the power line pattern 633 of the second inner layer 630.

Figure 6D:
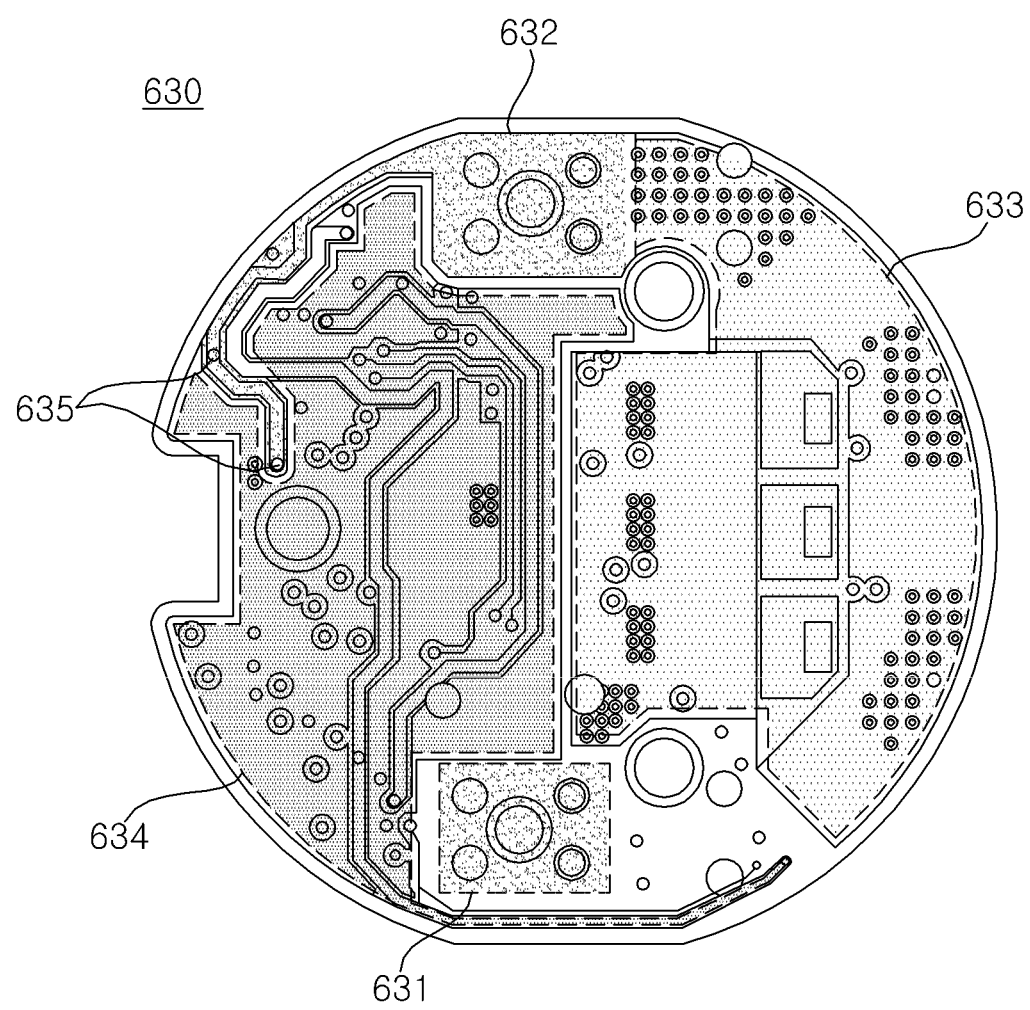

Referring to FIG. 6D, the output pattern 632 and the power line pattern 633 of the second inner layer 630 may be, for example, electrically connected to each other.

The input pattern 631 of the second inner layer 630 may be electrically disconnected on the second inner layer 630 from, for example, the output pattern 632 and the power line pattern 633 of the second inner layer 630.

The signal line pattern 634 of the second inner layer 630 may be electrically disconnected on the second inner layer 630 from, for example, the input pattern 631, the output pattern 632, and the power line pattern 633 of the second inner layer 630.

Furthermore, at least any one of the input pattern 641 and the output pattern 642 of the second outer layer 640 may be electrically disconnected on the second outer layer 640 from, for example, the power line pattern 643 of the second outer layer 640.

Figure 6E:
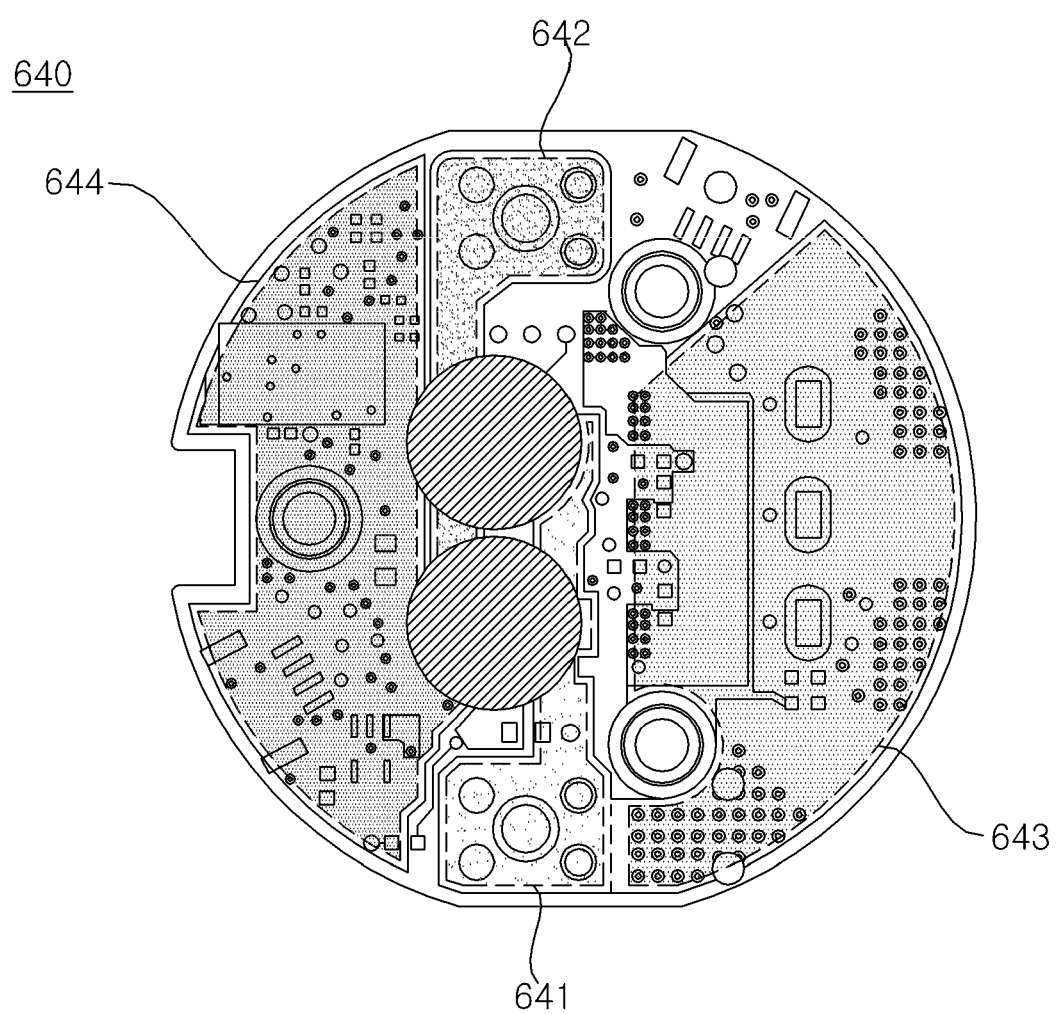

Referring to FIG. 6E, the input pattern 641 and the power line pattern 643 of the second outer layer 640 may be, for example, electrically connected to each other.

The output pattern 642 of the second outer layer 640 may be electrically disconnected on the second outer layer 640 from, for example, the input pattern 641 and the power line pattern 643 of the second outer layer 640.

The DC terminal capacitor C may be connected between, for example, the input pattern 641 and the output pattern 642 of the second outer layer 640.

Further, heat-generating elements, which generate heat by the operation of the motor 230, among the circuit elements included in the motor driving apparatus 200 may be mounted, for example, through the first outer layer 610.

The plurality of switching elements Sa, S'a, Sb, Sb, Sc, and S'c, included in the inverter 420, may be mounted on the one surface 60a of the printed circuit board 60, so that all of the switching elements Sa, S'a, Sb, S'b, Sc, and S'c may be electrically connected to the power line patterns 613, 623, 633, and 643 through, for example, via holes formed on the power line patterns 613, 623, 633, and 643 of the plurality of layers 610 to 640.

The plurality of switching elements Sa, S'a, Sb, Sb, Sc, and S'c may be connected to the power line pattern 613 of the first outer layer 610, so as to be disposed in an area corresponding to a position of the air outlet 566 on the one surface 60a of the printed circuit board 60. While FIG. 6E illustrates an example in which the upper arm switching elements Sa, Sb and Sc are disposed adjacent to the edge of the printed circuit board 60 in the area corresponding to the position of the air outlet 566, and the lower arm switching elements S'a, S'b and S'c are disposed adjacent to the center of the printed circuit board 60 in the area corresponding to the position of the air outlet 566. However, the present disclosure is not limited thereto.

A current may flow to the plurality of switching elements Sa, S'a, Sb, Sb, Sc, and S'c through the power line patterns 613, 623, 633, and 643 of the plurality of layers 610 to 640, such that even when a current level increases due to an increase in the capacity of the inverter 310, the current may flow stably to the plurality of switching elements Sa, S'a, Sb, Sb, Sc, and S'c of the inverter 420 compared to a case where a current is supplied to the inverter 420 through a single power line pattern. Furthermore, a cross-sectional area of the patterns, through which the current flows, increases such that a possibility of heat generation of the patterns 613, 623, 633, and 643 may be reduced.

In addition, the DC terminal resistive element Rdc may be mounted on one surface 60a of the printed circuit board 60, so as to be electrically connected to, for example, the power line pattern 613 of the first outer layer 610.

In this case, referring to FIGS. 6B to 6D, it can be seen that the DC terminal resistive element Rdc is mounted on the first outer layer 610 at a position corresponding to the signal line patterns 624 and 634 on the first and second inner layers 620 and 630.

Accordingly, it can be seen that a current greater than or equal to a predetermined level flows only to the output pattern 612 of the first outer layer 610 through the DC terminal resistive element Rdc connected to the power line pattern 613 of the first outer layer 610.

Furthermore, the control circuit 540 for controlling the operation of the inverter 420 may be mounted on the one surface 60a of the printed circuit board 60, so as to be electrically connected to the signal line pattern 614 of the first outer layer 610.

In addition, the voltage generator 440 of the motor driving apparatus 200 may also be mounted on the one surface 60a of the printed circuit board 60, so as to be electrically connected to the signal line pattern 614 of the first outer layer 610.

The signal line patterns 614 to 644 of the plurality of layers 610 to 640 may be electrically connected to each other through, for example, a plurality of via holes.

The signal line pattern 614 of the first outer layer 610, on which the control circuit 540 is mounted, may be connected not only to the signal line patterns 624 and 634 of the first and second inner layers 620 and 630 but also to the output pattern 642 of the first outer layer 640, through the via holes 625.

As a result, the signal line pattern 614 of the first outer layer 610 may be electrically connected to the output pattern 642 of the second outer layer 640.

As described above, the circuit elements, connected to the power line pattern 613 of the first outer layer 610, and the circuit elements, connected to the signal line pattern 614 of the first outer layer 610, may be connected to the same ground through the output patterns 612 and 642 which are electrically connected to each other.

The EMI noise, generated by the turn-on/off of the switching elements Sa, S'a, Sb, S'b, Sc, and S'c may be transmitted to the output pattern 612 of the first outer layer 610 through the power line pattern 613 of the first outer layer 610, according to a current flow.

In this case, when considering a resistance of a transmission path or potential difference, the EMI noise, transmitted to the output pattern 612 of the first outer layer 610, is output as it is to the outside of the printed circuit board 60 without flowing again into the signal line pattern 614 of the first outer layer 610 through the output pattern 642 of the second outer layer 640. Accordingly, the EMI noise, transmitted to the output pattern 612 of the first outer layer 610 through the power line pattern 613 of the first outer layer 610, may have a significantly reduced effect on the circuit elements connected to the signal line pattern 614 of the first outer layer 610.

In the present disclosure, the printed circuit board 60 is composed of four layers, but the printed circuit board 60 is not limited thereto, and it may be sufficient to have two or more layers.

In the case where the printed circuit board 60 is composed of two layers, the printed circuit board 60 may include only the first outer layer 610, on which the heat-generating elements are mounted, which generate heat by the operation of the motor 230 among the circuit elements included in the motor driving apparatus 200, and the second outer layer 640, on which the rest of the elements are mounted.

In this case, as illustrated in FIG. 6B, the plurality of switching elements Sa, S'a, Sb, S'b, Sc, and S'c may be connected to the power line pattern 613 of the first outer layer 610, and the control circuit 540 may be connected to the signal line pattern 614 of the first outer layer 610.

Furthermore, the power line pattern 613 of the first outer layer 610 may be connected to the output pattern 612 of the first outer layer 610, and the signal line pattern 614 of the first outer layer 610 may be connected to the output pattern 642 of the second outer layer 640 through the via holes.

Accordingly, even when the printed circuit board 60 includes two layers, the EMI noise, transmitted to the output pattern 612 through the power line pattern 613 of the first outer layer 610, is output as it is to the outside of the printed circuit board 60 without flowing again into the signal line pattern 614 of the first outer layer 610 through the output pattern 642 of the second outer layer 640, when considering a resistance of a transmission path or potential difference. Accordingly, the effect of the EMI noise on the circuit elements connected to the signal line pattern 614 of the first outer layer 610 may be significantly reduced.

The features of the present disclosure will be more clearly understood from the accompanying drawings and should not be limited by the accompanying drawings, and it is to be appreciated that all changes, equivalents, and substitutes that do not depart from the spirit and technical scope of the present disclosure are encompassed in the present disclosure.

Similarly, although operations are described in a specific order in the drawings, it is not understood that these operations need to performed in the specific order or in a sequential order in order to acquire a suitable result and that all operations illustrated in the drawings need to be performed. In a specific case, multitasking and parallel processing may be more suitable.

Although the exemplary embodiments of the present disclosure have been disclosed for illustrative purposes, those skilled in the art will appreciate that various modifications, additions and substitutions are possible, without departing from the scope and spirit of the embodiments as disclosed in the accompanying claims.

What is claimed is:

1. A cleaner comprising a motor driving apparatus, the motor driving apparatus comprising:
   a direct current (DC) terminal capacitor configured to store DC power;
   an inverter comprising a plurality of switching elements connected to the DC terminal capacitor, the inverter being configured to convert the DC power into alternating current (AC) power and to output the AC power;
   a control circuit configured to control an operation of the inverter;
   a motor configured to operate based on the AC power output from the inverter;
   an impeller connected to the motor and configured to circulate air through at least a portion of the motor driving apparatus; and
   a printed circuit board having:
      a first surface that mounts the plurality of switching elements and faces toward the motor and the impeller, and
      a second surface that mounts the DC terminal capacitor,
   wherein the plurality of switching elements are mounted on a first area of the first surface, the first area being positioned in a flow path of the air circulated by the impeller, and
   wherein the control circuit is mounted on a second area of the first surface, the second area being different from the first area.

2. The cleaner of claim 1, further comprising a motor body that defines:
   a motor accommodating part that accommodates the motor; and
   an air outlet configured to discharge the air circulated by the impeller,
   wherein the first area of the printed circuit board is disposed at a position corresponding to the air outlet.

3. The cleaner of claim 2, wherein the first area is disposed within a predetermined distance from an edge of the first surface of the printed circuit board.

4. The cleaner of claim 1, further comprising a DC terminal resistive element disposed between the DC terminal capacitor and the inverter, the DC terminal resistive element being mounted on the first area of the first surface of the printed circuit board.

5. The cleaner of claim 4, wherein the printed circuit board comprises a plurality of layers, the plurality of layers comprising a first outer layer that defines the first surface and a second outer layer that defines the second surface,
   wherein each of the plurality of layers comprises:
      an input pattern configured to receive the DC power,
      an output pattern configured to output the DC power, a power line pattern configured to carry the current, and a signal line pattern that is electrically disconnected from the power line pattern and configured to communicate a signal with the control circuit.

6. The cleaner of claim 5, wherein:

the plurality of switching elements are connected to the power line pattern of the first outer layer;

the control circuit is connected to the signal line pattern of the first outer layer;

the output pattern and the power line pattern of the first outer layer are electrically connected to each other;

the output pattern and the power line pattern of the second outer layer are electrically disconnected from each other; and the signal line pattern of the first outer layer is electrically connected to the output pattern of the second outer layer through via holes.

7. The cleaner of claim 6, wherein:

the plurality of switching elements are connected to the power line pattern of each of the plurality of layers; and the DC terminal resistive element is connected to the power line pattern of the first outer layer.

8. The cleaner of claim 7, wherein the plurality of layers further comprise a first inner layer and a second inner layer disposed between the first outer layer and the second outer layer, wherein the first inner layer is disposed adjacent to the first out layer, and the second inner layer is disposed between the first inner layer and the second outer layer, and wherein:

the input pattern, the output pattern, and the power line pattern of the first outer layer are electrically connected to one another;

at least one of the input pattern or the output pattern of the first inner layer is electrically disconnected from the power line pattern of the first inner layer;

at least one of the input pattern or the output pattern of the second inner layer is electrically disconnected from the power line pattern of the second inner layer;

the input pattern and the power line pattern of the second outer layer are electrically connected to each other; and the output pattern of the second outer layer is electrically disconnected from the input pattern and the power line pattern of the second outer layer.

* * * * *